United States Patent [19]

Folz

[11] 4,278,997
[45] Jul. 14, 1981

[54] REMOTE VOLUME CONTROL FOR TELEVISION SET

[76] Inventor: Raymond L. Folz, 22-40 123rd St., College Point, N.Y. 11356

[21] Appl. No.: 936,830

[22] Filed: Aug. 25, 1978

[51] Int. Cl.³ .......................... H04B 1/06; F16C 1/12
[52] U.S. Cl. .................. 358/194.1; 74/10 A; 334/9; 455/352
[58] Field of Search ............................ 358/194, 194.1; 325/390, 393; 334/9, 10; 74/10 A, 10.8, 10.85; 64/2 R; 455/352, 353, 354, 355

[56] References Cited

U.S. PATENT DOCUMENTS

| | | | |
|---|---|---|---|
| 1,450,284 | 4/1923 | Goldschmidt | 64/2 R |
| 1,925,991 | 9/1933 | Shaw | 64/2 R |
| 2,004,918 | 6/1935 | Mitchell | 64/2 R |
| 2,627,056 | 1/1953 | Gleason | 74/10 A |
| 2,743,797 | 5/1956 | Whitaker | 74/10 A |
| 2,934,963 | 5/1960 | Gribin et al. | 74/10 A |
| 3,018,585 | 1/1962 | Stanzel | 64/2 R |
| 3,768,019 | 10/1973 | Podowski | 358/194 |
| 3,984,779 | 10/1976 | Hughes | 358/194 |
| 3,988,680 | 10/1976 | Kolm | 358/194 |
| 4,081,840 | 3/1978 | Kolm | 358/194 |
| 4,114,098 | 9/1978 | Booty | 325/390 |

Primary Examiner—Raymond F. Cardillo, Jr.
Assistant Examiner—Randall P. Myers

[57] ABSTRACT

A remote volume control for television sets wherein an unshielded flexible metal shaft is directly connected to the television volume control at one end and at the other to a motor driven gear train mounted to the side or top of the set adjacent to the volume control. Remotely positioned hand-held switching means and batteries permit the user to effect clockwise and counter-clockwise rotation of the volume control shaft to control volume.

3 Claims, 2 Drawing Figures

REMOTE VOLUME CONTROL FOR TELEVISION SET

BACKGROUND OF THE INVENTION

The present invention concerns a greatly simplified mechanism for remote control of the volume of a television set. Although remote control channel selectors incorporating volume control are known, not all television sets are adaptable to be controlled by such devices, and where provision has been made for such control, the cost is considerable. The present invention does not seek to control all selection capabilities, but rather to make it possible for the volume of any television set, regardless of the individual design features thereof, to be regulated remotely with the expenditure of a very small sum. The use of such a device shall be primarily to lower or make inaudible the audio portion of spot commercials. It will be understood that there is a great need for an inexpensive reliable device of this type since typically four or five sequentially programmed commercials are inserted at ten-minute intervals in some of the more popular television shows. Moreover, invariably the loudness of the audio portion of such commercials is increased beyond the setting which the viewer has selected for the program itself.

Heretofore, there have been a number of devices suggested in the patent literature for remote regulation of the various controls or selector means of radio or television sets. Invariably, such mechanisms are complicated and often require particular adaptation to the design of a television or radio receiver. Early examples of such remote controls for radio may be found in U.S. Pat. Nos. 1,925,991; 1,980,172; 2,036,948; 2,149,754. More recent controls adapted for the television are illustrated and disclosed in U.S. Pat. Nos. 2,934,963 and 3,984,779.

Whereas, some of these prior attempts are interesting, the controls provided for radio have been generally strictly mechanical, which is to say, are limited with respect to the distance from which control may be effected; whereas, the more recent television controls require special adaptation to particular television designs, are complex and therefore expensive.

The control device of the present invention obviates many of the difficulties of prior mechanisms. The essential aspect of the invention is use of an unshielded (therefore unanchored) flexible metal shaft, driven by a very inexpensive and conventional (DC battery operated or AC) motor with an accompanying reduction gear train. The motor is energized remotely by a simple hand-held switch (forward or reverse), which may be part of a simple flash light battery type casing. The aforementioned flexible shaft is made readily and universally adaptable to be connected to the shaft of a television set. Consequently, the housing containing the motor operated gear train can be placed and attached to the side or top of a television set adjacent to the volume control wherever that may be situated in a particular design, thus permitting the flexible shaft to extend from the housing to the volume control shaft. Since the flexible shaft is unshielded, this provides great freedom for such placement since the unshielded flexible cable does not require anchoring to the set at its free end.

SUMMARY OF THE INVENTION

In accordance with the present invention, a remote control mechanism for regulating the volume of a television set is disclosed which comprises an unshielded flexible metal shaft adapted to be connected to the volume control of a television, a forward and reverse electric motor and reduction gearing assembly for driving said shaft and a housing for said motor and gearing assembly, the housing being attached to the side or other portion of the television set adjacent to the television set's volume control. A remote hand-held forward and reverse switching means is connected to the said motor by a length of electrical wire to permit forward or reverse actuation of the switching means thereby causing corresponding energization of the motor and clockwise or counter-clockwise rotation of the flexible shaft to regulate volume. The fact that the flexible metal shaft is unshielded permits it to be connected directly to the television volume control without anchoring or attachment of a surrounding shield to the set. Thus, the motor and gearing assembly can simply be attached to the side or top of the television set adjacent to the volume control wherever this may be situated for different designs.

DESCRIPTION OF A PARTICULAR EMBODIMENT

Figure 1:
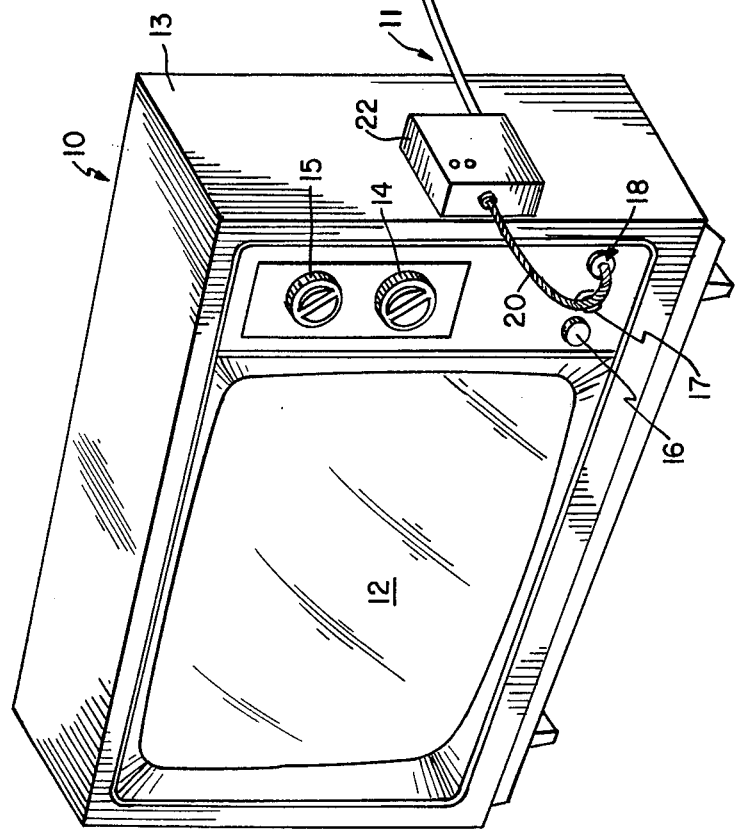
FIG. 1 is a perspective view of a television set equipped with the remote volume control apparatus of the present invention.

Referring now to the drawing and initially to FIG. 1, a television set 10 has been shown equipped with the remote colume control 11 constructed according to the present invention. The television set 10 is of conventional construction having picture screen 12, console-type housing 13, and is equipped with video tuning and selection knobs 14, 15 in a conventional manner. Knobs 16, 17 are typically for controlling picture quality and stability, and volume control has been indicated generally by reference numeral 18.

Figure 2:
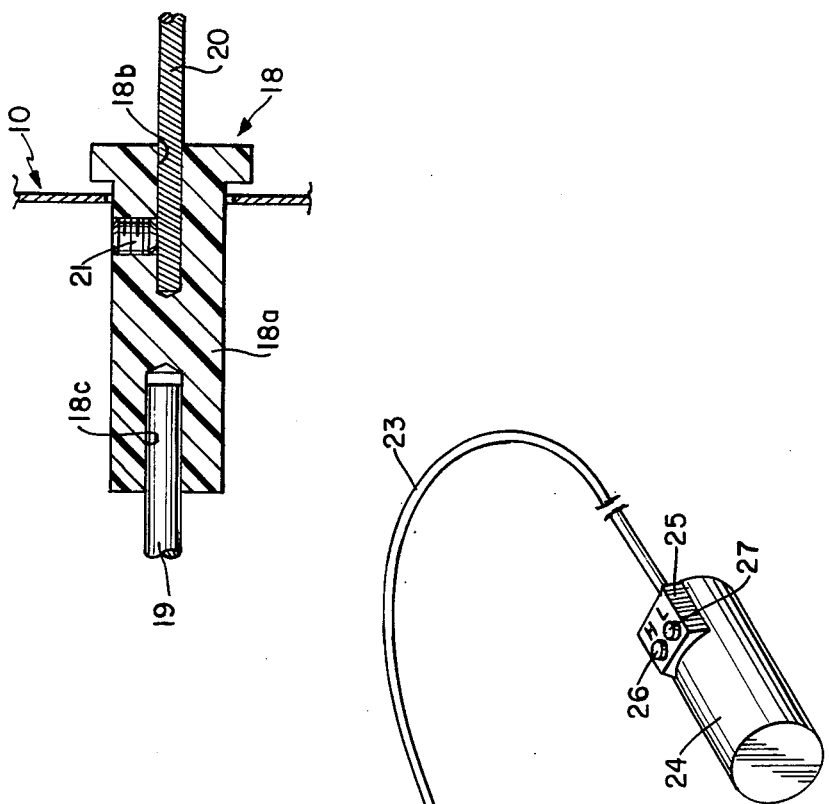
FIG. 2 is a partial cross section of the volume control shaft of the television set and the attachment thereto of the remote control means illustrated in FIG. 1.

In accordance with the invention, the normal volume control knob has been removed from its connection with volume control shaft 19 and a volume control adapter 18 (FIG. 2) has been substituted therefor. Several adaptors 18a will be provided with different sized bores 18c to accommodate different diameter shafts 19 so that slip-on attachment thereto can be achieved. In the illustrated embodiment, the end of a resilient, flexible metal shaft 20 is inserted within the recess 18b and is secured therein by a set screw 21. The shaft 20 is curved about an arc of approximately 180°, the end of the shaft 20 being received within a housing 22, which is secured by appropriate means to the side of the television set. The housing 22 encloses a battery operated motor and reduction gear train assembly which is conventional and has not therefore been illustrated. The flexible shaft 20 is connected within the housing 22 to the output of the reduction gear train so that rotation of the shaft 20 at a relatively slow speed will occur when the motor is energized. A covered flexible electric wire lead 23 is connected within housing 22 to the motor therein and at the other to a hand-held remote switch control 24 containing a plurality of ordinary "flashlight" batteries (not shown). Within the electric lead 23 are two electrical wires, each being respectively connected to the twoway switch 25, whose construction is well-known and conventional. Buttons, 26 and 27 may be depressed to separately energize a circuit connected to the motor in the well-known manner to cause forward and reverse movement of the motor. Accordingly, actuation of button 26 (marked "H") will effect energization of the battery operated motor in one direction resulting in rotation of the flexible shaft 20 to increase volume. Conversely, actuation of switch button 27 (marked "L") will effect counter rotation of shaft 20 to decrease volume.

In accordance with a very important aspect of the present invention, it will be noted that the flexible metal shaft 20 is unshielded. That is to say, the shaft 20 is not covered or surrounded by a shield or conduit as is the case with most conventional controls involving actuation by a flexible shaft. Consequently, there is no need to provide for anchoring of an outer shield, and the flexible shaft 20 may be directly and freely connected between the output of the aforementioned reduction gear train and the shaft of the volume control. This aspect provides greater freedom and utility since it is merely necessary to attach the housing 22 at some convenient location adjacent to the volume control of the television set in order for the flexible shaft 20 to be connected to the volume control. The shaft 20 should be of sufficient flexibility and resiliency to permit it to proceed from wherever the housing 22 is attached (to the side or to the top of the television set) to the volume control. Since this placement will vary greatly depending upon the design of individual television sets, the present invention provides the needed flexibility for accommodating such different designs which is possible by the use of a simple unshielded flexible shaft.

The remainder of the components of the remote control system are those which have been used, for example, in operating remotely controlled toys. These components are mass produced, are very inexpensive and are readily available to perform the particular function illustrated. Since the forces necessary to rotate the volume control shaft of a television set are of a very low order, the battery operated motor and reduction gearing assembly are not required to produce high output force, which assists in obviating the need to shield the flexible shaft 20.

It will be understood that the above description has been of a particular embodiment and is therefore representative. For example, although the embodiment illustrated and described has included a battery operated DC motor, it is obvious that a motor energized by alternating current, controlled by appropriate forward-/reverse switch means could be employed. Therefore, in order to understand the scope of the invention, reference should be made to the appended claims.

I claim:

1. A remote control mechanism for regulating a volume control means of a television, said volume control means including a rotary shaft, said mechanism comprising an unshielded, resilient flexible shaft, means for connecting said unshielded, resilient flexible shaft directly and coaxially to the rotary shaft of said volume control means, a forward/reverse electric motor and reduction gearing train assembly, said gearing train being connected to said motor for reducing the output revolutions of said motor, a housing for said motor and gearing train assembly, said housing being adapted to be attached to said set adjacent to said volume control, said flexible shaft being connected to the output of said gearing train for rotation thereby and being of a length, flexibility and strength sufficient to interconnect said gearing train and said rotary shaft to effect rotation of the latter when said gearing train rotates said flexible shaft, a remotely hand-held housing having externally operated forward and reverse switching means and an electrical wire interconnecting said switching means and said electric motor means.

2. The remote control mechanism according to claim 1 wherein said motor is adapted to be energized by direct current and said remote hand-held housing contains batteries for operating said motor.

3. The remote control mechanism according to claim 1 wherein said motor and gear train housing is attached to the side of said television set.

* * * * *